Aug. 29, 1967 D. A. TREMERE 3,338,758

SURFACE GRADIENT PROTECTED HIGH BREAKDOWN JUNCTIONS

Filed Dec. 31, 1964 3 Sheets-Sheet 1

DOUGLAS A. TREMERE
INVENTOR.

BY Roger S. Borovoy
ATTORNEY

DOUGLAS A. TREMERE
*INVENTOR.*

BY [signature]
*ATTORNEY*

DOUGLAS A. TREMERE
*INVENTOR.*

BY Roger S. Borovoy
*ATTORNEY*

United States Patent Office 3,338,758

Patented Aug. 29, 1967

3,338,758

SURFACE GRADIENT PROTECTED HIGH BREAKDOWN JUNCTIONS

Douglas A. Tremere, Mountain View, Calif., assignor to Fairchild Camera and Instrument Corporation, Syosset, N.Y., a corporation of Delaware Filed Dec. 31, 1964, Ser. No. 422,608
2 Claims. (Cl. 148—33.5)

ABSTRACT OF THE DISCLOSURE

A PNP semiconductor device having a lightly doped, out-diffused layer at the surface and a diffused region in close proximity with the base region and surrounding same, being spaced laterally from the base region at their most proximate point by less than about two microns.

The subject invention relates to a channelless semiconductor device having a high junction breakdown voltage, and to a method of fabricating same. More particularly, the invention relates to semiconductor devices, particularly PNP transistors, which have a surface of their active area substantially free of channel regions of the conductivity type opposite to that of the body of semiconductor material; and to a method of fabricating same.

Recently, much attention has been directed to the problem of surface channel formation, particularly in PNP silicon planar transistors. Channeling is a condition whereby a depletion of the P-type impurities at the surface of the collector region produces beneath the silicon dioxide passivation layer a region of semiconductor material which, while actually being P-type, exhibits certain properties similar to N-type semiconductor material. Such a layer, when it acts like N-type material, forms an extension of the N-type base layer of the transistor beneath the oxide layer over the collector region. This phenomenon is described in the Proceedings of the IEEE, June 1963, on pages 12A–13A. To overcome these "induced" channels, the prior art processes, such as those described in the IEEE reference, use P+ annular bands of heavily-doped P-type semiconductor material diffused into the collector region of the transistor. These P+ annular bands are appreciably spaced away from the N-type base region, and are for the express purpose of terminating the induced channel region before it reaches the edge of the semiconductor wafer. Thus the prior art, accepting the fact that it is not possible to eliminate these channels, has found a way of accurately insuring their termination before they extend to the edge of the semiconductor wafer.

Contrary to these prior art practices, the subject invention provides a process whereby the surface channel over the active region of the device is completely eliminated. Although one aspect of the process of this invention is the diffusion of a P+ band-shaped region similar to the region formed in the prior art method, the location of this region in the two processes is much different. The band-shaped region in this invention is very close to the base region. While it might appear obvious to move the band-shaped region closer to the base region, such is far from the truth. If, in the process of the prior art, the band-shaped region were moved closer to the N-type base region, a P+N junction between the band-shaped region and the base region would be formed; the high concentration of impurities at the P+N junction would substantially reduce the breakdown voltage, thus defeating the very purpose of the P+ annular band of the prior art. For that reason this band was never placed closer to the N-type region than would result in a substantial reduction in the voltage rating of the resulting device.

However, contrary to the prior art, when the process of the subject invention is employed, the band-shaped P+ region is moved very close to the N-type base region—thus eliminating entirely the channel in the active area of the device—without decreasing the breakdown voltage of the collector-base junction. This is accomplished in the process of this invention by making some important departures from prior art processing. First, prior to any of the diffusions to form the regions of the semiconductor device, the conductivity-type determining impurities in the region of the semiconductor body near its surface are diffused outwardly from the surface to leave a region of the body near its surface with a concentration of impurities substantially less than the concentration of the impurities in the underlying region of the body beneath the surface region. This phenomenon is discussed in the Journal of Applied Physics, vol. 35, No. 9, pages 2695–2701 (1946). Second, contrary to prior art practice, the band-shaped region is diffused prior to the base region. And third, the diffusion fronts of the band-shaped region and the base region are allowed to meet, or almost meet, at the surface in the completed device when all diffusions have been completed.

The above process of the subject invention results in a semiconductor device having a surface of its active area substantially free of channel regions of the conductivity type opposite to that of the body of semiconductor material. Briefly, the resulting device comprises a body of semiconductor material of one conductivity type having at the surface a concentration of conductivity-type determining impurities in the region of said body near the surface substantially less than such concentration in the underlying region of said body beneath the surface region. The device also has a diffused region (which may be the base region of a transistor) of the opposite conductivity type, preferably N-type, extending from the surface through the surface region into the underlying region of the body and forming a PN junction with the body extending to the surface. The portion of the PN junction between the diffused region and the surface region has a concentration gradient less than the gradient of that portion of the junction between the diffused region and the underlying region. Finally, the device has a band-shaped diffused region of the same conductivity type as the body surrounding the other diffused region in close proximity therewith at the surface and, extending into the body from the surface. The diffusion front of the band-shaped diffused region is spaced laterally from the adjacent diffusion front of the other diffused region at their most proximate point by a distance less than about 2 microns.

The process and devices of the subject invention will be more clearly understood by reference to the following more detailed explanation, and the drawings, in which:

FIG. 1(*a*)–(*f*) are sectional views illustrating the basic steps of fabrication of a semiconductor device according to the process of the subject invention;

Figure 1A:
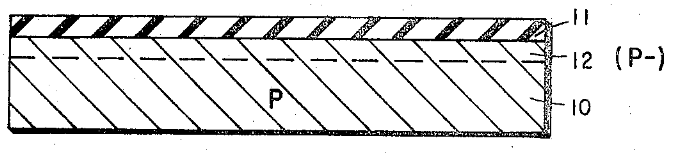
Figure 1B:
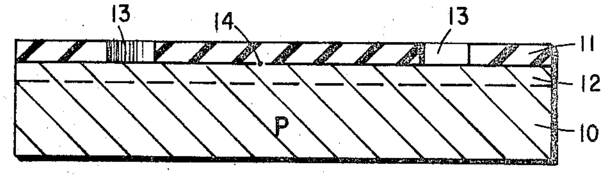
Figure 1C:
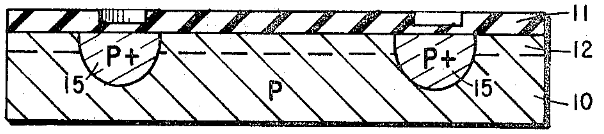
Figure 1D:
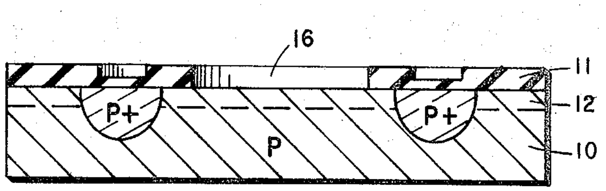
Figure 1E:
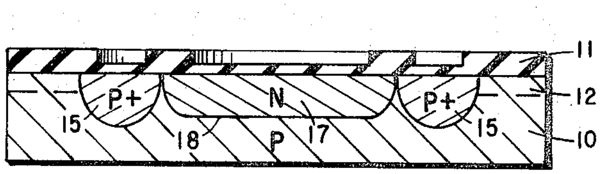
Figure 1F:
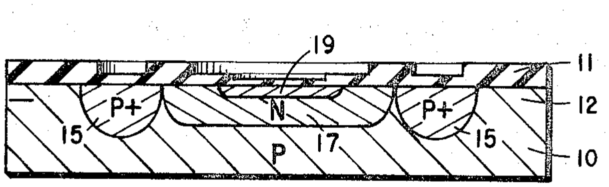

Referring now to the drawings, and in particular to FIG. 1, the method of fabricating the devices of this invention is illustrated. The process of this invention begins with a wafer of semiconductor material which has been previously uniformly doped with impurities which render the wafer a particular conductivity type. The preferred embodiment of this invention uses a P-type wafer. The impurities used to dope the wafer are of the type which outdiffuse readily. For P-type wafers, gallium and aluminum are used, preferably gallium. Outdiffusion and oxidation are normally accomplished simultaneously. As shown in FIG. 1(*a*), the wafer 10 is heated in an oxidizing atmosphere, such as in the presence of water vapor, at a sufficiently high temperature (e.g., 1200° C.) to form a layer of silicon dioxide on the surface while at the same time depleting a surface region 12 of P-type impurities. The depleted surface region 12 is still P-type, but of higher resistivity; therefore surface region 12 has been designated "P−" to indicate a layer having a concentration of P-type impurities substantially less than the concentration of impurities in the underlying region of wafer 10 beneath it.

Next, a band-shaped opening 13 is made in the oxide coating 11, shown in cross-section in FIG. 1(*b*), which leaves a coated inner portion 14 of the surface of wafer 10 within its periphery. Impurities of the same conductivity type as the wafer (P-type for example) are than diffused through the band-shaped opening 13 to form a band-shaped region 15 shown in FIG. 1(*c*). This region is more heavily doped and of the same conductivity type as the wafer. Therefore, it has been designated as "P+." Preferably, during the diffusion of region 15, its surface is recoated with silicon dioxide by carrying out the diffusion in an oxidizing atmosphere. However, if the diffusion is not carried out in an oxidizing atmosphere so that the surface of region 15 is simultaneously recoated, it may be subsequently recoated by a separate oxidation or oxide-deposition step both well known in the art. Then a second opening 16 shown in FIG. 1(*d*) is formed in the oxide coating over the inner portion 14 of the surface of wafer 10. The outer periphery of this second opening 16 is closely adjacent to the inner periphery of the first band-shaped opening 13 as shown in FIG. 1(*d*). For example, the peripheries may be spaced by about 1 mil.

Impurities of the opposite conductivity type (e.g., N-type) are then diffused through the second opening 16 in the oxide coating into both the surface region 12 and the underlying region of body 10 to form a second diffused region 17 of the opposite conductivity type from wafer 10 within the periphery of the first diffused region 15, and in close proximity with that first diffused region. A PN junction 18 is formed between the second diffused region 17 and body 10. Junction 18 extends to the surface of body 10 beneath oxide layer 11. The structure at this stage is shown in FIG. 1(*e*).

Because of the difference between the impurity concentration in surface region 12 and the underlying portion of body 10, the portion of PN junction 18 between diffused region 17 and surface region 12 has a gradient less than the gradient of the portion of PN junction 18 between diffused region 17 and the underlying portion of body 10. This results in a device having a high breakthrough voltage, as will be discussed later. The structure shown in FIG. 1(*e*) represents an NP diode. To complete the device, an additional hole in oxide layer 11 is formed in a conventional manner by photoengraving or the like in the portion of the oxide layer over region 17, and a metal ohmic contact deposited in the hole to make ohmic contact to region 17. This procedure is well known in the art as described, for example in U.S. Patent 3,108,359, assigned to the same assignee as this invention. A similar ohmic contact may be placed on the backside of wafer 10 to make contact with the P-type region of the diode. With the attachment of wires to these ohmic contacts, a diode is completed.

If a transistor structure is desired, an opening may be formed in the oxide layer over N-type region 17 prior to contact attachment. P-type impurities are then diffused through that opening to form P-type emitter region 19 shown in FIG. 1(*f*). In a conventional manner, ohmic contacts are attached to the base, emitter, and collector regions as discussed above, to complete the device.

Figure 2:
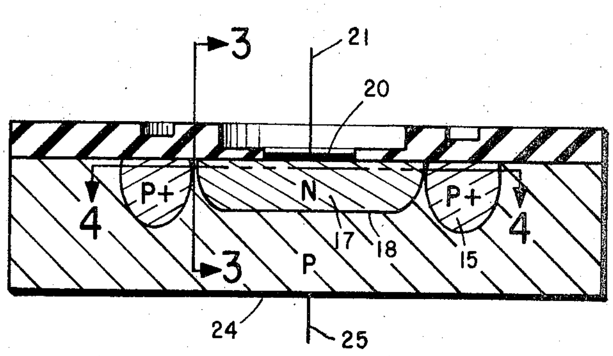
FIG. 2 represents a completed diode of the invention.

Referring now to FIG. 2, a completed diode made according to this invention is shown. This structure is the same as shown in FIG. 1(*e*) except that ohmic contact 20 has been attached to N-type region 17, and ohmic contact 24 to P-type wafer 10. It is important to note in FIG. 2 that the diffusion front (the inner periphery) of the band-shaped region 15 is very close to the adjacent diffusion front (the outer periphery) of diffused region 17. In fact, these diffusion fronts are spaced laterally at their most proximate point by a distance of less than about 2 microns. As illustrated in FIG. 2, the adjacent diffusion fronts between regions 15 and 17 are approximately tangential at the surface.

Figure 3:
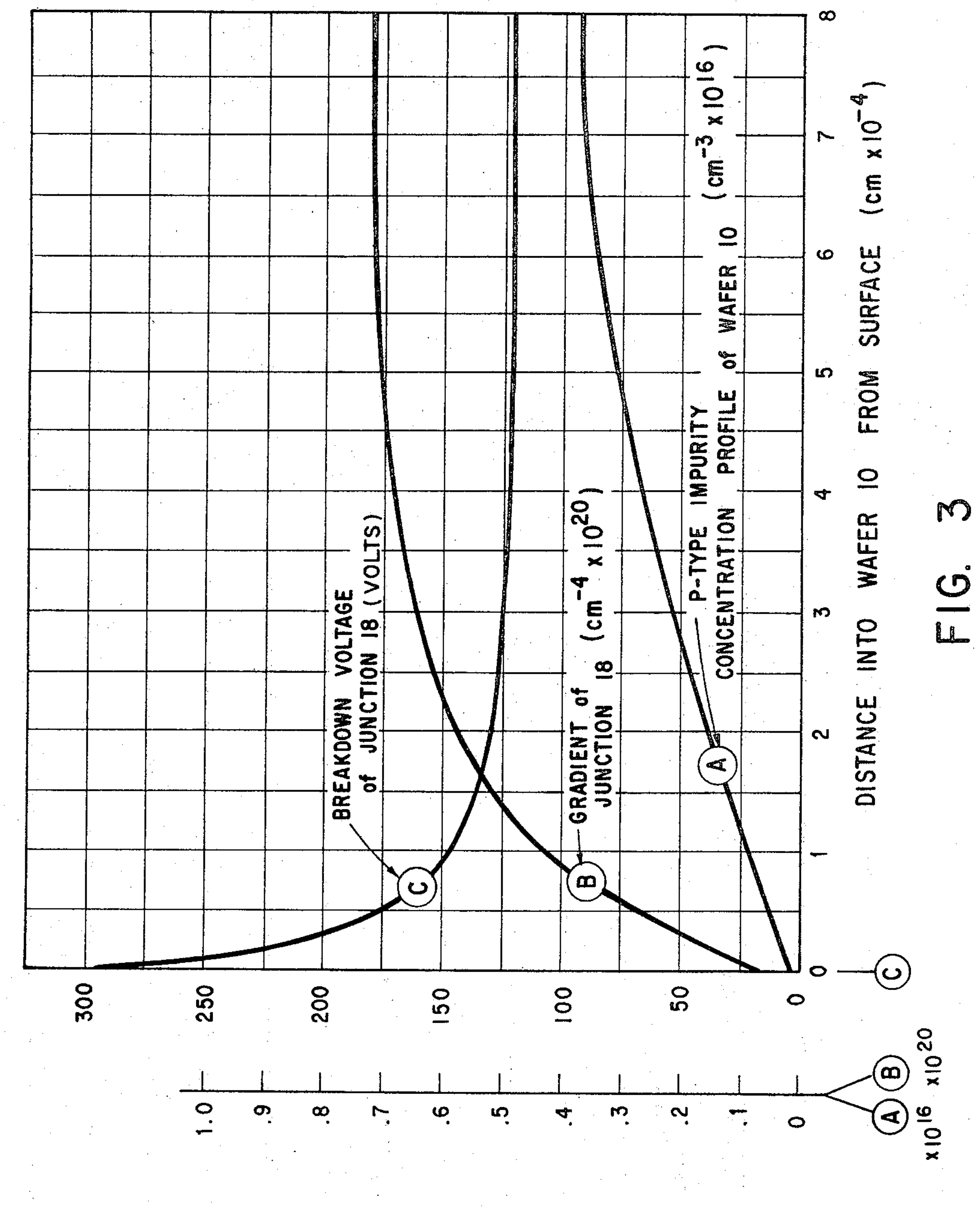
FIG. 3 represents a graph showing the relationships between the distance along the surface of the semiconductor body taken along the section 3—3 in FIG. 2 and the base junction gradient, the junction breakdown voltage, and the concentration profile.

The relationship between the diffusion fronts of regions 15 and 17 can be better understood by the graph of FIG. 3, wherein the gradient of junction 18 is plotted against the inward distance along junction 18 from the surface of wafer 10 in curve B. This plot was taken along the section 3—3 of FIG. 2. The concentration of P-type impurities in the wafer was also plotted against the same inward distance on the same graph of FIG. 3 in curve A. Note that the concentration of the P-type impurities of wafer 10 decreases closer to the surface of the wafer. This phenomenon is the result of the outdiffusion step.

The increasing gradient of junction 18 away from the surface affects the breakdown voltage of the devices of the invention. Curve C of FIG. 3 also shows the breakdown voltage of junction 18 plotted as a function of the distance away from the surface of wafer 10. It is most important to notice that the junction breakdown voltage decreases in the direction away from the surface. This means that when a voltage equal to or in excess of the breakdown voltage is applied across junction 18, breakdown will first occur in the underlying portion of wafer 10 beneath the surface. A device which breaks down in the underlying portion of the wafer prior to breaking down at the surface is a much more stable device than one which first breaks down at the surface. Where breakdown first occurs at the surface, the breakdown voltage of the junction tends to change, both with time and with use. To the contrary, where breakdown first occurs in the underlying portion of the wafer, the breakdown voltage changes very little, if any, with use and age. Accordingly, the device of the subject invention is a much more reliable semiconductor device than the common devices of the prior art wherein the breakdown of the junction first occurs at the surface.

Figure 4:
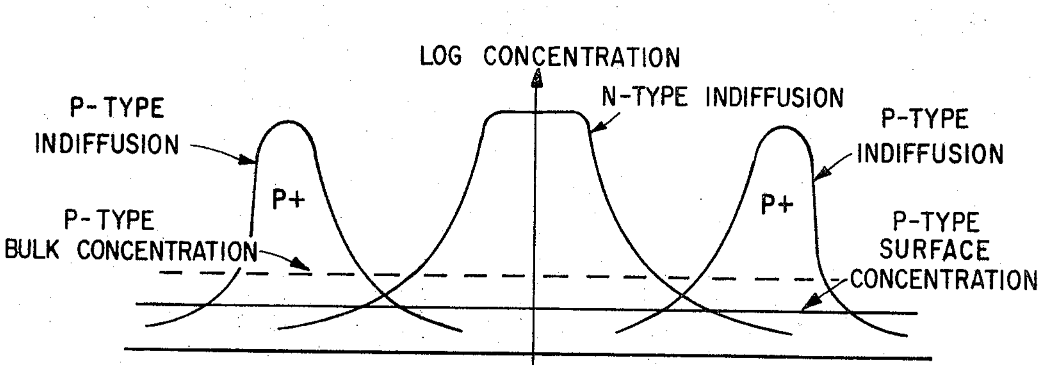
FIG. 4 represents a concentration profile taken along the plane 4—4 in FIG. 2.

Referring now to FIG. 4, the impurity concentration of the device of this invention is illustrated along a slice of the wafer taken through the plane 4—4 of the wafer shown in FIG. 2. It is interesting to note that wherever the concentration of the N-type indiffused impurities is equal to the concentration of the P-type indiffused impurities, these respective concentrations are each less than the concentration of the P-type impurities initially present in wafer 10 (known as the "bulk concentration"). On the other hand, these concentrations are each equal to or slightly greater than the surface concentration in the outdiffused P layer 12 shown in FIG. 1(*a*). These relationships should obtain in order to have the junction gradient increasing away from the surface as shown in FIG. 3.

Figure 5:
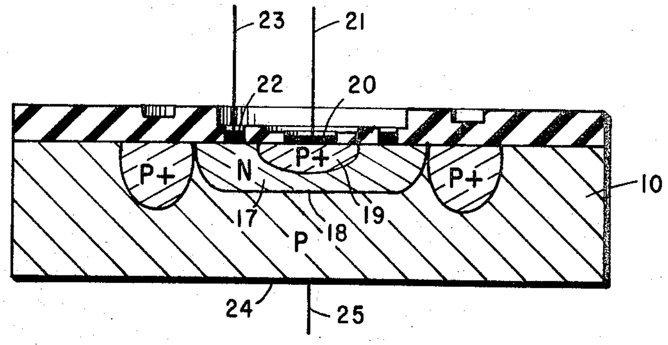
FIG. 5 represents a cross-sectional view of a completed PNP transistor of the invention.

Referring now to FIG. 5, a transistor made in accordance with this invention is shown. This device is similar to the transistor shown in FIG. 1(*f*), except that emitter contact 20, emitter lead 21, base contact 22, base lead 23, collector contact 24, and collector lead 25 are all shown. The device of FIG. 5 was prepared in accordance with this invention, as described above.

While not intended to limit the generality of the process described above, a specific example of the process of the invention will be given below. However, this example is not intended to place restrictions upon the scope of this invention not expressed in the appended claims.

*Example*

A silicon semiconductor wafer which was uniformly doped with gallium to obtain a resistivity of 3 ohm-cm., was cleaned and etched in a conventional manner. The wafer was then oxidized in the presence of water vapor for 2 hours at 1250° C. to obtain a structure as shown in FIG. 1(*a*). After a ten second dip in hydrofluoric acid and a rinse in deionized water, a photoresist mask was applied in a conventional manner to the surface of oxide layer 11 having openings where ring-shaped aperture 13 is to be formed as shown in FIG. 1(*b*). Boron was then predeposited and diffused in a conventional manner at 1200° C. in an oxidizing atmosphere for a period of about 4 hours. The wafer, then appearing as shown in FIG. 1(*c*), was cleaned and aperture 16 etched in the oxide layer using conventional photoetching techniques employing a hydrofluoric acid etch. Phosphorus was predeposited in aperture 16 at 805° C. for 30 minutes, and subsequently diffused for 1 hour in an oxidizing atmosphere at 1200° C. to form the structure shown in FIG. 1(*e*). Finally, the opening was made again by conventional photoetching techniques, through which impurities are to be diffused to form emitter region 19 in FIG. 1(*f*). Boron was predeposited at 1200° C., and diffused at 1100° C. for 10 minutes in an oxidizing atmosphere in the presence of water vapor, and 25 additional minutes without the water vapor, to obtain the device shown in FIG. 1(*f*) having diffused emitter region 19.

Aluminum was finally evaporated over both surfaces of the wafer after the oxide had been removed from the underside and appropriate openings in the top surface had been made in order to form contacts 20, 22 and 24, shown in FIG. 5. After cleaning, the aluminum was removed by photoetching to leave only contacts 20, 22, and 24. These aluminum contacts were then alloyed at about 550° C. for 30 minutes, thereby leaving ohmic contacts to regions 19, 17, and 10, all as shown in FIG. 5. The resulting transistor had a breakdown voltage of the base-collector junction 18 of about 120 volts. Breakdown of this device occurred beneath the surface of wafer 10, providing a substantial increase in reliability over conventional devices wherein breakdown occurs at the surface.

The description given above has been in general terms, and not intended to limit the scope of the invention as claimed. For a precise definition of that scope, reference is made to the claims which follow.

What is claimed is:

1. A semiconductor device having a surface of its active area substantially free of channel regions of the conductivity type opposite to that of the body of semiconductor material, which comprises:

a body of P-type semiconductor material having a surface, the concentration of conductivity-type determining impurities in the region of said body near said surface being less than about one-half such concentration in the underlying region of said body beneath the surface region;

a first N-type diffused region extending from said surface through said surface region into said underlying region of said body and forming a PN junction with said body extending to said surface, the portion of said PN junction between said first diffused region and said surface region having a concentration gradient less than the gradient of that portion of said junction between said first diffused region and said underlying region;

a second P-type diffused region surrounding said first diffused region in close proximity therewith at the surface, extending into said body from said surface, the diffusion front of said second diffused region being spaced laterally from the adjacent diffusion front of said first diffused region at their most proximate point by a distance less than about 2 microns.

2. A transistor having a surface of its active area substantially free of channel regions of the conductivity type opposite to that of the body of semiconductor material, which comprises:

a body of P-type semiconductor material having a surface, the concentration of conductivity-type determining impurities in the region of said body nearest said surface being less than about one-half such concentration in the underlying regions of said body beneath the surface region, said body forming the collector region of said transistor;

a diffused N-type base region extending from said surface through said surface region into said underlying region of said body and forming a PN junction with said body extending to said surface, the portion of said PN junction between said base region and said surface region having a concentration gradient less than the gradient of that portion of said junction between said base region and said underlying region;

an additional P-type diffused region surrounding said base region in close proximity therewith at the surface, extending into said body from said surface, the diffusion front of said additional diffused region being spaced laterally from the diffusion front of said base region at their most proximate point by a distance less than about 2 microns;

a P-type emitter region nested within said base region and extending to said surface therefrom, forming a PN junction with said base region.

References Cited

UNITED STATES PATENTS

| | | | |
|---|---|---|---|
| 2,953,486 | 9/1960 | Atalla | 148—191 |
| 3,183,128 | 5/1965 | Leistiko | 148—191 X |
| 3,200,019 | 8/1965 | Scott. | |
| 3,226,614 | 12/1965 | Haenichen | 148—33 X |

HYLAND BIZOT, *Primary Examiner.*